United States Patent
Zur

(10) Patent No.: US 11,199,401 B1
(45) Date of Patent: Dec. 14, 2021

(54) END-POINT DETECTION FOR SIMILAR ADJACENT MATERIALS

(71) Applicant: APPLIED MATERIALS ISRAEL LTD., Rehovot (IL)

(72) Inventor: Yehuda Zur, Tel-Aviv (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 17/011,955

(22) Filed: Sep. 3, 2020

(51) Int. Cl.
*G01B 15/02* (2006.01)
*H01J 37/30* (2006.01)
(Continued)

(52) U.S. Cl.
CPC .......... *G01B 15/02* (2013.01); *H01J 37/3005* (2013.01); *H01J 37/3026* (2013.01); *H01J 37/31* (2013.01)

(58) Field of Classification Search
CPC ...... G01B 15/02; H01J 37/3005; H01J 37/31; H01J 37/3023; H01J 37/3026; H01J 37/304
See application file for complete search history.

(56) References Cited

U.S. PATENT DOCUMENTS 6,670,610 B2   12/2003   Shemesh et al.
8,709,269 B2   4/2014    Shemesh
(Continued)

OTHER PUBLICATIONS

Hill, et al., "FIB Endpoint Detection and Depth Resolution", Microelectronic Engineering 21, 1993, pp. 201-204.

*Primary Examiner* — David E Smith
(74) *Attorney, Agent, or Firm* — Kilpatrick Townsend & Stockton LLP

(57) ABSTRACT

A method of evaluating a region of a sample that includes a first sub-region and a second sub-region, adjacent to the first sub-region, the region comprising a plurality of sets of vertically-stacked double-layers extending through both the first and second sub-regions with a geometry or orientation of the vertically-stacked double layers in the first sub-region being different than a geometry or orientation of the vertically-stacked double layers in the second region resulting in the first sub-region having a first milling rate and the second sub-region having a second milling rate different than the first milling rate, the method including: milling the region of a sample by scanning a focused ion beam over the region a plurality of iterations in which, for each iteration, the focused ion beam is scanned over the first sub-region and the second sub-region generating secondary electrons and secondary ions from each of the first and second sub-regions; detecting, during the milling, at least one of the generated secondary electrons or the secondary ions; generating, in real-time, an endpoint detection signal from the at least one of detected secondary electrons or secondary ions, the endpoint detection signal including a fast oscillating signal having a first frequency and a slow oscillating signal having a second frequency, slower than the first frequency; analyzing the fast and slow oscillating signals to determine original first and second frequencies of the fast and slow oscillating signals; and estimating, in real-time, a depth of each of the first and second sub-regions based on the determined first and second frequencies.

20 Claims, 7 Drawing Sheets

(51) Int. Cl.
*H01J 37/302* (2006.01)
*H01J 37/31* (2006.01)

(56) References Cited

U.S. PATENT DOCUMENTS

| | | |
|---|---|---|
| 9,046,475 B2 | 6/2015 | Langer et al. |
| 10,204,762 B2* | 2/2019 | Fuller .................. H01J 37/304 |
| 10,217,621 B2 | 2/2019 | Ruach-Nir et al. |
| 2002/0074494 A1* | 6/2002 | Lundquist ............. H01J 37/304 |
| | | 250/307 |
| 2005/0173631 A1* | 8/2005 | Ray ...................... G01N 23/225 |
| | | 250/307 |
| 2020/0013603 A1 | 1/2020 | Ruach-Nir et al. |

* cited by examiner

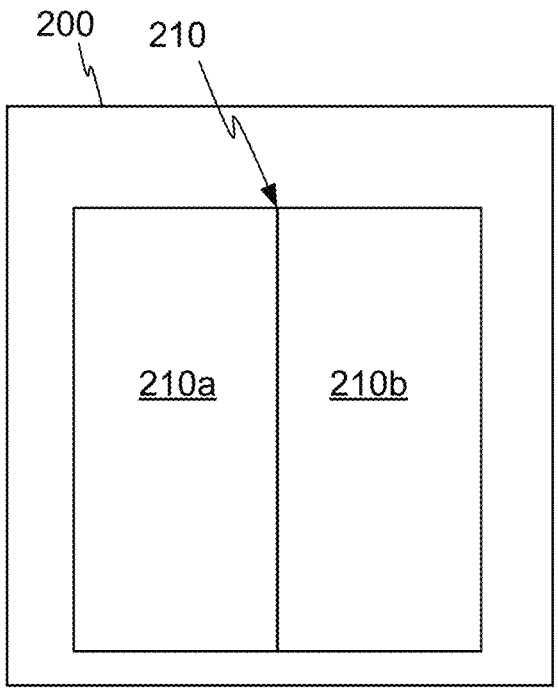
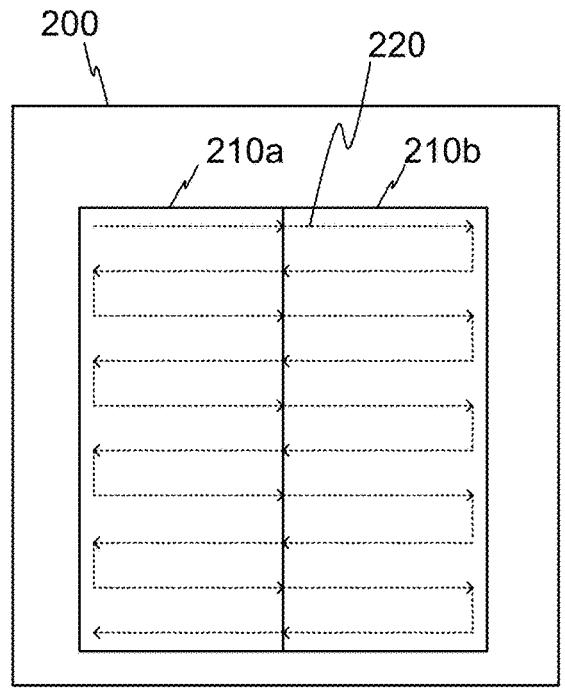
FIG. 2A  FIG. 2B
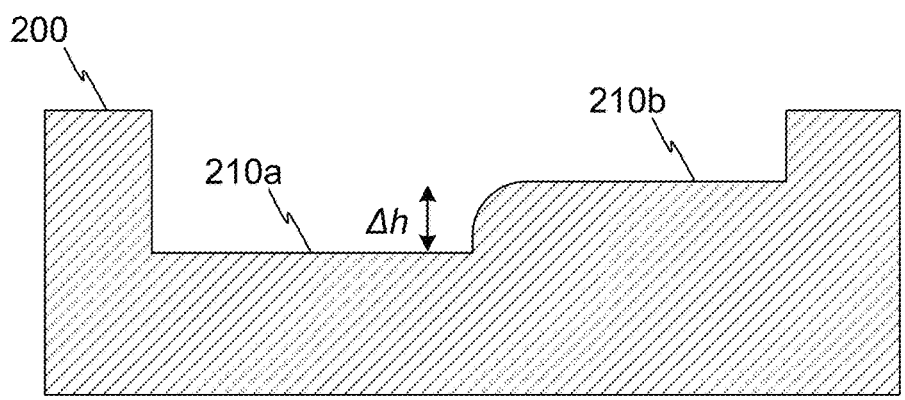
FIG. 2C

END-POINT DETECTION FOR SIMILAR ADJACENT MATERIALS

BACKGROUND OF THE INVENTION

In the study of electronic materials and processes for fabricating such materials into an electronic structure, a sample of the electronic structure can be used for microscopic examination for purposes of failure analysis and device validation. For instance, a sample such as a silicon wafer that includes one or more electronic structures formed thereon can be milled and analyzed with a focused ion beam (FIB) to study specific characteristics of the structures formed on the wafer.

Many modern electronic structures include many different alternating layers of material in one or more portions of the structure. Removing one or more selected layers to analyze or study characteristics of a structure on the sample formed with the multiple layers is known as delayering and can be done with a FIB tool. As a delayering process is carried out, secondary electrons and secondary ions from the milled material are generated. The secondary electrons and secondary ions can be detected to analyze characteristics of the milled layers and the structure.

In some instances it is important to reliably locate the interface between different layers of material in a sample. For example, it may be important to mill a hole fully through one or more layers of a sample to image a feature or other layer buried deep within the sample. In order to do such, end point detection techniques can be employed that evaluate one or more signals that are dependent on the material being milled, such as secondary electron yield, secondary ion flux and others. For example, when alternating layers of material are deposited over a semiconductor wafer that yield different numbers of electrons when milled, various detection techniques, such as end point detection or time-of-flight secondary ion mass spectrometry (TOF-SIMS), can monitor a signal representing secondary electron yield to determine which layer of material is currently being milled. Knowing the manufacturing process used to fabricate the sample then allows the evaluation tool to determine when a layer of material A is milled through and the milling process reaches a layer of a different material, material B.

When an area of a sample that is being milled, however, includes two or more adjacent regions that have different milling rates, it can be difficult to precisely determine the milling depth of either region. Thus, improved methods of end point detection in some milling processes are desirable.

BRIEF SUMMARY OF THE INVENTION

Embodiments of the disclosure pertain to techniques that enable precise end point detection while delayering materials or regions of a substrate having nearly different milling rates (including similar but not identical milling rates). Some embodiments enable the milling depth of two distinct regions to be accurately estimated in real-time even though the distinct regions have different milling rates, rather than estimating an average milled depth for the total area of the milled region. In this manner, embodiments can be employed to enable delaying adjacent regions of a sample having different milling rates with precise endpoint detection without having to implement method for equating the milling rates completely.

In some embodiments a method of evaluating a region of a sample is provided. The sample can include a first sub-region and a second sub-region, adjacent to the first sub-region and the region can include a plurality of sets of vertically-stacked double-layers extending through both the first and second sub-regions with a geometry or orientation of the vertically-stacked double layers in the first sub-region being different than a geometry or orientation of the vertically-stacked double layers in the second region resulting in the first sub-region having a first milling rate and the second sub-region having a second milling rate different than the first milling rate. The method can include: milling the region of a sample by scanning a focused ion beam over the region a plurality of iterations in which, for each iteration, the focused ion beam is scanned over the first sub-region and the second sub-region generating secondary electrons and secondary ions from each of the first and second sub-regions; detecting, during the milling, at least one of the generated secondary electrons or the secondary ions; generating, in real-time, an endpoint detection signal from the at least one of detected secondary electrons or secondary ions, the endpoint detection signal including a fast oscillating signal having a first frequency and a slow oscillating signal having a second frequency, slower than the first frequency; analyzing the fast and slow oscillating signals to determine original first and second frequencies of the fast and slow oscillating signals; and estimating, in real-time, a depth of each of the first and second sub-regions based on the determined first and second frequencies.

In some embodiments a system is provided for evaluating a sample such as that described above. The system can include a vacuum chamber; a sample support configured to hold a sample within the vacuum chamber during a sample evaluation process; a focused ion beam (FIB) column configured to direct a second charged particle beam into the vacuum chamber; and a processor and a memory coupled to the processor. The memory can include a plurality of computer-readable instructions that, when executed by the processor, cause the system to: mill the region of a sample by scanning a focused ion beam over the region a plurality of iterations in which, for each iteration, the focused ion beam is scanned over the first sub-region and the second sub-region generating secondary electrons and secondary ions from each of the first and second sub-regions; detect, during the milling, at least one of the generated secondary electrons or the secondary ions; generate, in real-time, an endpoint detection signal from the at least one of detected secondary electrons or secondary ions, the endpoint detection signal including a fast oscillating signal having a first frequency and a slow oscillating signal having a second frequency, slower than the first frequency; analyze the fast and slow oscillating signals to determine original first and second frequencies of the fast and slow oscillating signals; and estimate, in real-time, a depth of each of the first and second sub-regions based on the determined first and second frequencies.

Still additional embodiments pertain to a non-transitory computer-readable memory that stores instructions for evaluating a region of a sample, such as the sample described above, by: milling the region of a sample by scanning a focused ion beam over the region a plurality of iterations in which, for each iteration, the focused ion beam is scanned over the first sub-region and the second sub-region generating secondary electrons and secondary ions from each of the first and second sub-regions; detecting, during the milling, at least one of the generated secondary electrons or the secondary ions; generating, in real-time, an endpoint detection signal from the at least one of detected secondary electrons or secondary ions, the endpoint detection signal including a fast oscillating signal having a first frequency and a slow oscillating signal having a second frequency, slower than the first frequency; analyzing the fast and slow oscillating signals to determine original first and second frequencies of the fast and slow oscillating signals; and estimating, in real-time, a depth of each of the first and second sub-regions based on the determined first and second frequencies.

Various implementations of the embodiments described herein can include one or more of the following features. Stopping the delayering process when a predetermined depth in at least one of the first and second sub-regions is reached. Estimating the milling depth in the first and second sub-regions based on a known thickness of the layers and/or the milling time in addition to the determined first and second frequencies. The detecting, during the milling, can detect the generated secondary electrons and the generating, in real-time, can generate an endpoint detection signal from the detected secondary electrons. The geometry of the vertically-stacked double layers in the first sub-region can be different than a geometry of the vertically-stacked double layers in the second region. A plurality of vias can be formed in the first sub-region and the second sub-region can be devoid of such vias.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 2A is a simplified illustration of a sample having a region formed therein that includes first and second sub-regions with similar but different milling rates;

FIG. 2B is a simplified illustration of an ion beam scan pattern used to delayer a portion of the sample shown in FIG. 2A according to known methods;

FIG. 2C is a simplified cross-sectional illustration of the sample shown in FIG. 1A after a portion of the sample has been delayered using the scan pattern depicted in FIG. 2B;

DETAILED DESCRIPTION OF THE INVENTION

Embodiments of the disclosure can delayer a region of a sample that includes multiple sets of alternating layers in two or more adjacent sub-regions where the different sub-regions have different milling rates. Some embodiments enable the milling depth of such adjacent but distinct sub-regions to be accurately estimated in real-time rather than estimating an average milled depth for the total area of the milled region.

Example Focused Ion Beam (FIB) Evaluation Tool

Figure 1:
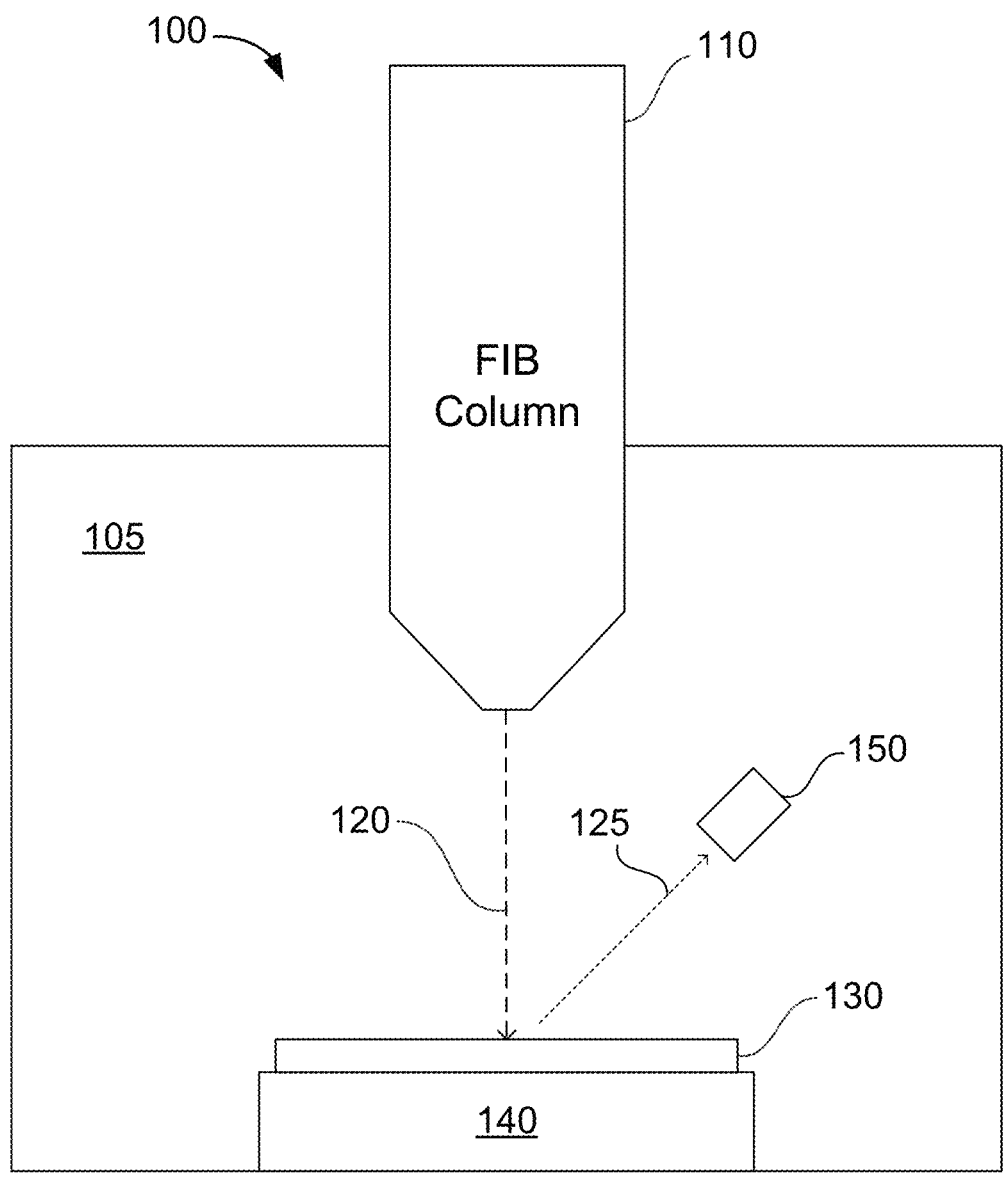
FIG. 1 is simplified illustration of a sample focused ion beam (FIB) evaluation system according to some embodiments of the disclosure.

In order to better understand and appreciate the disclosure, reference is first made to FIG. 1, which is a simplified schematic illustration of a focused ion beam (FIB) evaluation system 100 according to some embodiments of the disclosure. As shown in FIG. 1, system 100 can include, among other elements, a focused ion beam (FIB) column 110, a sample supporting element 140 and a secondary electron detector 150 (or in some embodiments a secondary ion detector or a combination of the two detectors working in parallel). FIB column 110 is operable to generate a charged particle beam 120 and direct the particle beam towards a sample 130 (sometimes referred to herein as an "object" or a "specimen) to mill or otherwise process the sample. The sample, for example a semiconductor wafer, can be supported on a supporting element 140 within a vacuum chamber 105.

FIB column 110 can mill (e.g., drill a recess in) sample 130 by irradiating the sample with charged particle beam 120 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 3,000 volts to 30,000 volts. The beam current is typically in the range from several pico amps to several micro amps, depending on the FIB instrument configuration and the application, and the pressure is typically controlled between $10^{-10}$ to $10^{-5}$ mbar in different parts of the system and in different operation modes.

A delayering process can be done by: (i) locating a location of interest that should be milled in order to remove a certain thickness of material from the sample, (ii) moving the sample (e.g., by a mechanical supporting element) so that the sample is located under the field-of-view of the FIB unit, and (iii) milling the sample to remove a desired amount of material in the location of interest. The delayering process can include forming a recess in the sample (usually sized a few microns to few hundreds of microns in the lateral dimensions).

The milling process typically includes scanning a charged particle beam back-and-forth (e.g., in a raster or other scan pattern) across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns. Each iteration (or frame) in which the ion beam is scanned across the region being milled is typically measured in microseconds and removes a very small amount of material (e.g., as low as 0.01 atomic layers using a low i-probe (e.g., 10 pA) or as much as 1000 atomic layers using a high i-probe (e.g., 1000 nA)) such that the scan pattern is repeated many thousands or even millions of times to etch a hole to a desired depth.

During a milling operation the charged particle beam 120 generated by FIB column 110 propagates through the vacuumed environment formed within vacuum chamber 105 before impinging on sample 130. Secondary electrons and ions 125 are generated in the collision of ions with the sample and detected by detector 150. The detected secondary electrons or ions can be used to analyze characteristics of the milled layers and the structure and/or can be used to determine an endpoint of a milling process.

While not shown in FIG. 1, FIB evaluation system 100 can include a number of additional components including, but not limited to, one or more gas nozzles to deliver process gases to chamber 105, vacuum and other valves to control the pressure within chamber 105, and one or more lenses to direct the charged particle beam among other components. System 100 can also include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Endpoint Detection Challenges

System 100 is one example of an evaluation system that can be used in accordance with the techniques disclosed herein to delayer or otherwise mill a region of a sample and accurately stop the milling process at a desired depth even when the milled region has two or more sub-regions with different milling rates. In such situations, for example where a region of a sample that is being delayered has two or more different sub-regions that are made up of mostly the same material and thus exhibit similar but different milling rates (e.g., milling rates that are within 20% of each other in some instances and within 10% of each other in other instances), it can be challenging to use previously known endpoint detection techniques to accurately determine the depth at which the sample is milled at any given time. To illustrate, reference is made to FIG. 2A, which is a simplified top view illustration of a sample 200. As shown in FIG. 2A, sample 200, which as an example can be a semiconductor wafer, includes a region 210 (sometimes referred to as a "frame") that is to be milled. Region 210 includes two sub-regions 210a and 210b that comprise predominantly similar material but have different milling rates. For example, each of regions 210a, 210b can include multiple sets of the same alternating vertically stacked layers of two or different materials but the milling rate of region 210a can be slightly faster than or slightly slower than the milling rate of region 210b. In some instances the different milling rates can be caused, for example, by sub-region 210a having a different geometry than that of sub-region 210b even though the two sub-regions include predominantly similar material. In other instances the different milling rates can be caused, for example, by sub-region 210a having a different crystallographic direction than sub-region 210b or a combination of both different geometries and different crystallographic directions in the two regions.

Regardless of the reason for the different milling rates, in some milling processes it is desirable to mill region 210 by scanning a focused ion beam across the entirety of the region at a specific (and constant) beam velocity or scan rate. For example, FIG. 2B depicts an exemplary scan pattern 220 that can be used to delayer the sample 200 shown in FIG. 2A. Scan pattern 220 traverses the entirety of region 210, including both sub-region 210a and sub-region 210b with a single continuously scanned beam at a constant velocity or scan rate and with other parameters of the milling process (e.g., beam width, beam strength, etc.) held constant. As a result, as the milling process proceeds (e.g., after the ion beam is scanned across region 210 many thousands of times or even millions of times), region 210 will exhibit a non-uniform profile where the sub-region 210a or 210b having the faster milling rate is milled deeper than the other sub-region with the slower milling rate.

FIG. 2C, which is a simplified cross-sectional illustration of sample 200 shown in FIG. 2A in which region 210a has a faster milling rate than region 210b. FIG. 2C depicts sample 200 after a portion of the sample has been delayered using the scan pattern depicted in and discussed with respect to FIG. 2B. The difference in milled depth between the two milled regions 210a, 210b is shown as Δh. Because regions 210a, 210b are milled at different rates yet include similar materials, it can be difficult to know the precise depth at which the sample is milled in each of the separate areas 210a, 210b at any given time in the milling process using convention end point detection techniques. For example, due to the different milling rates between the sub-regions, more layers of material might be removed in sub-region 210a as compared to sub-region 210b resulting in a milled portion of sub-region 210a being deeper than the milled portion in sub-region 210b as shown in FIG. 2C. The resolution for distinguishing between the adjacent sub-regions can be roughly the beam spot size. Because of the size of the milling beam (e.g., hundreds of nanometers in some instances), detector 150 cannot distinguish secondary electrons generated from milling sub-region 210a from electrons generated from milling the sub-region 210b. Thus, the secondary electron count cannot be used as an accurate endpoint detection signal in such situations.

Endpoint Detection for Double Layers According to Embodiments of the Disclosure

Figure 3A:
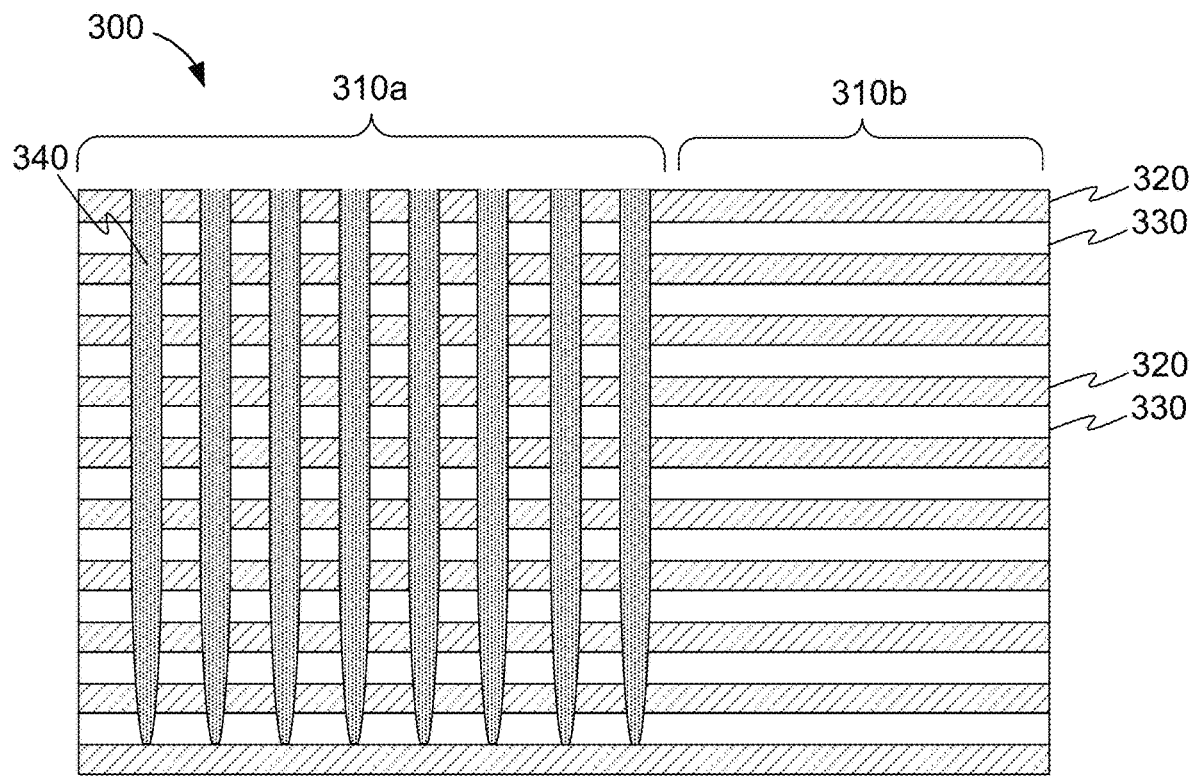
FIG. 3A is a simplified cross-sectional illustration of a sample having multiple alternating layers of two different materials formed on the wafer according to some embodiments.
Figure 3B:
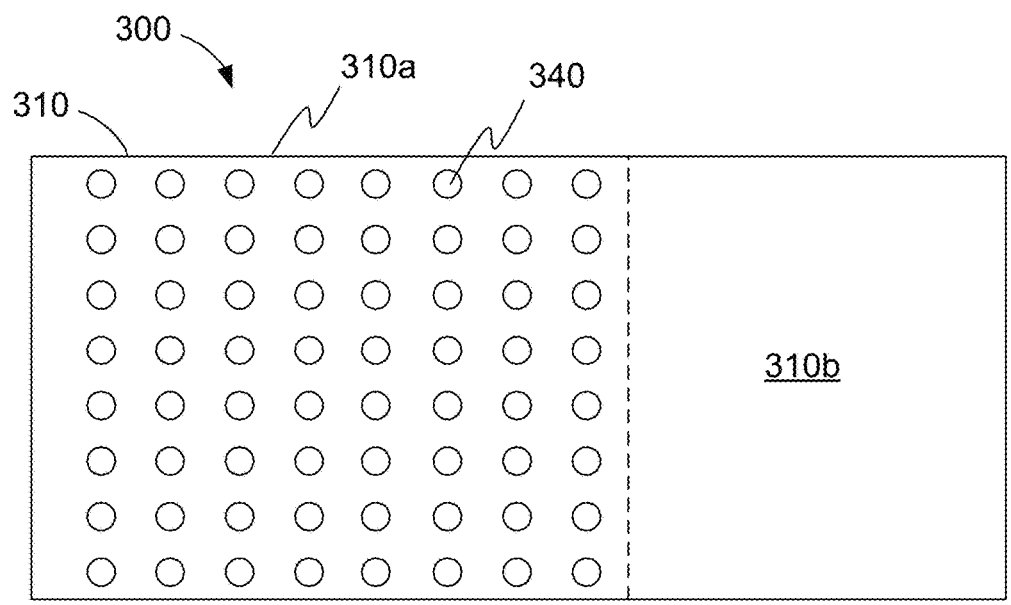
FIG. 3B is a simplified top view of the sample shown in FIG. 3A.

Embodiments of the disclosure provide a solution to accurately determining an endpoint of delayering processes in which adjacent regions have different milling rates but include multiple alternating layers of the same material. To better illustrate some embodiments of the disclosure, reference is made to FIGS. 3A and 3B. FIG. 3A is a simplified cross-sectional view of a sample 300 that includes a region 310 having adjacent sub-regions 310a and 310b, while FIG. 3B is a simplified top plan view of the sample. Sample 300 and region 310 can be representative of sample 200 and region 210 discussed above with respect to FIGS. 2A and 2B.

As shown in FIGS. 3A and 3B, region 300 can include multiple alternating layers 320, 330 of different material that extend across the entirety of region 300 including both of sub-regions 310a, 310b. Within region 310a, multiple holes, such as vias 340, are formed through the alternating sets of layers 320, 330 and filled with a third material that is different from the material in each of layers 320, 330. Thus, while a substantial portion of the material make-up of sub-region 310a is the same as that of sub-region 310b, the geometry of sub-region 310a includes vias 340 that are not present in sub-region 310b, which, in turn, results in the milling rate of sub-region 310a being different than that of sub-region 310b.

Figure 4A:
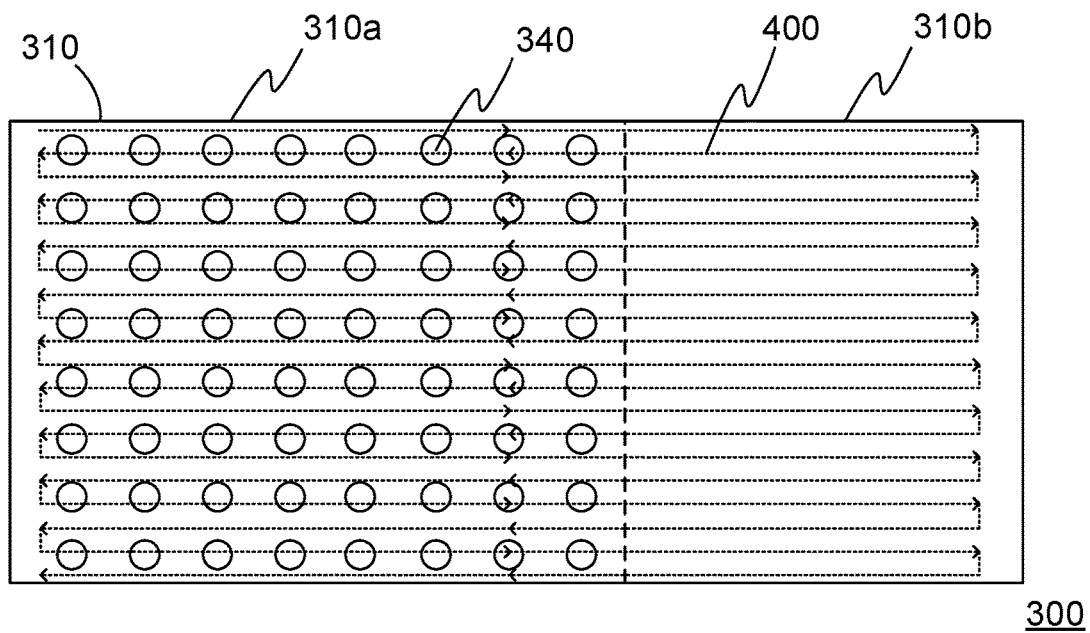
FIG. 4A is a simplified illustration of an ion beam scan pattern used to delayer a portion of the sample shown in FIGS. 3A and 3B according to some embodiments.
Figure 4B:
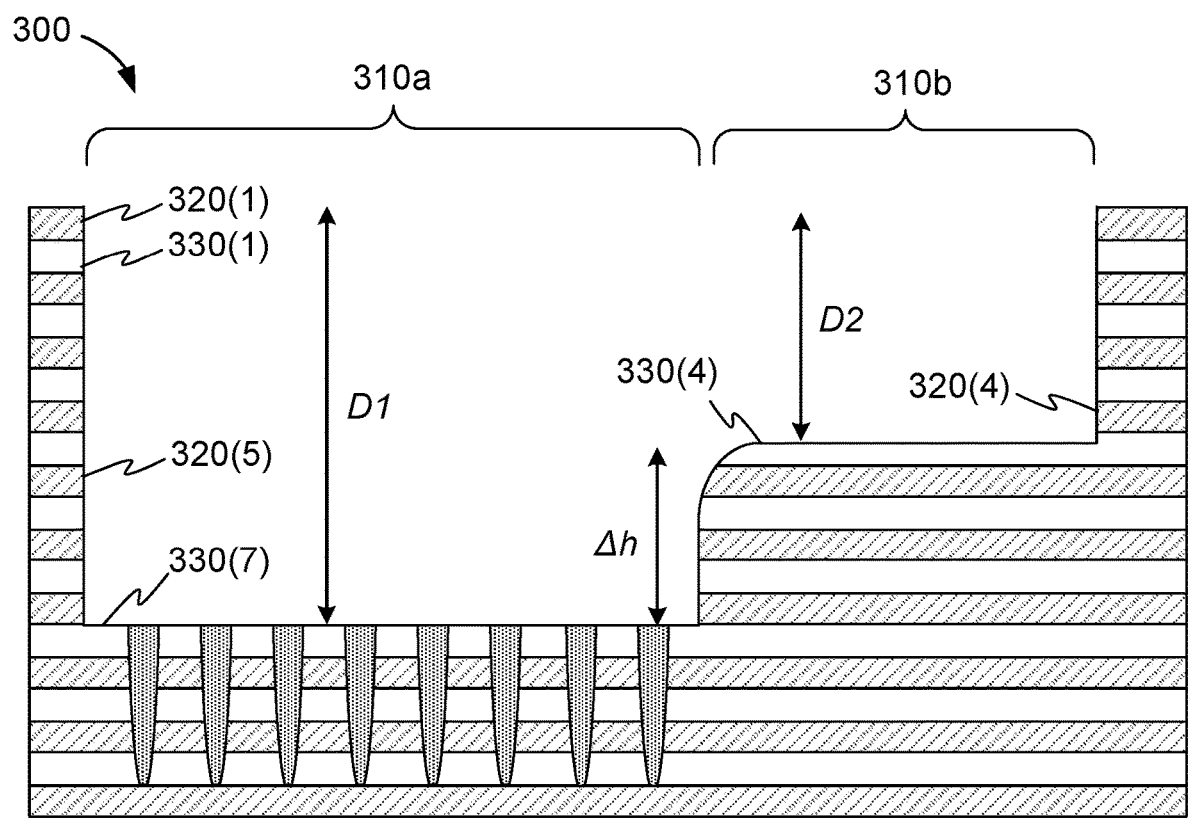
FIG. 4B is a simplified cross-sectional illustration of the sample shown in FIGS. 3A and 3B after it has been subject to a delayering process according to some embodiments.

FIG. 4A is a simplified illustration of a scanning pattern 400 that can be employed in a sample evaluation process in which region 310 of sample 300 is delayered. Scanning pattern 400 can be similar or identical to scanning pattern 200 such that each iteration of scanning pattern 400 mills both sub-region 310a and sub-region 310b. As a delaying process proceeds, the depth at which each of sub-regions 310a, 310b will differ due to the different milling rates of the two sub-regions. For example, as shown in FIG. 4B, which is a simplified cross-sectional view of sample 300 after region 310 has been milled a given amount of iterations, sub-region 310a can be milled to a depth of D1 while sub-region 310b is only milled to a shallower depth of D2. The difference between D1 and D2 is represented in FIG. 4B as Δh.

For the particular scan frame or iteration represented in FIG. 4B, the focused ion beam will mill layer 330(7) in sub-region 310a and layer 330(4) in sub-region 310b in the same frame. In many delayering processes, end point detection techniques that evaluate one or more signals that are dependent on the material being milled, such as secondary electron yield, can typically be employed to determine the milled depth. For example, when alternating layers of material are deposited over a semiconductor wafer that yield different numbers of electrons when milled, end point detection techniques can monitor a signal representing secondary electron yield to determine which layer of material is currently being milled. Given the scenario depicted in FIGS. 4A and 4B, however, the endpoint detection signal can be considered a mixed signal. That is, for any particular scan frame during the milling process, the endpoint detection signal can include components (e.g., electrons) generated from the same or a similar material at different depths in the different sub-regions, standard endpoint detection techniques cannot be reliably used to determine the precise depth of the milling process in either of the sub-regions.

Illustrative Example

Figure 5:
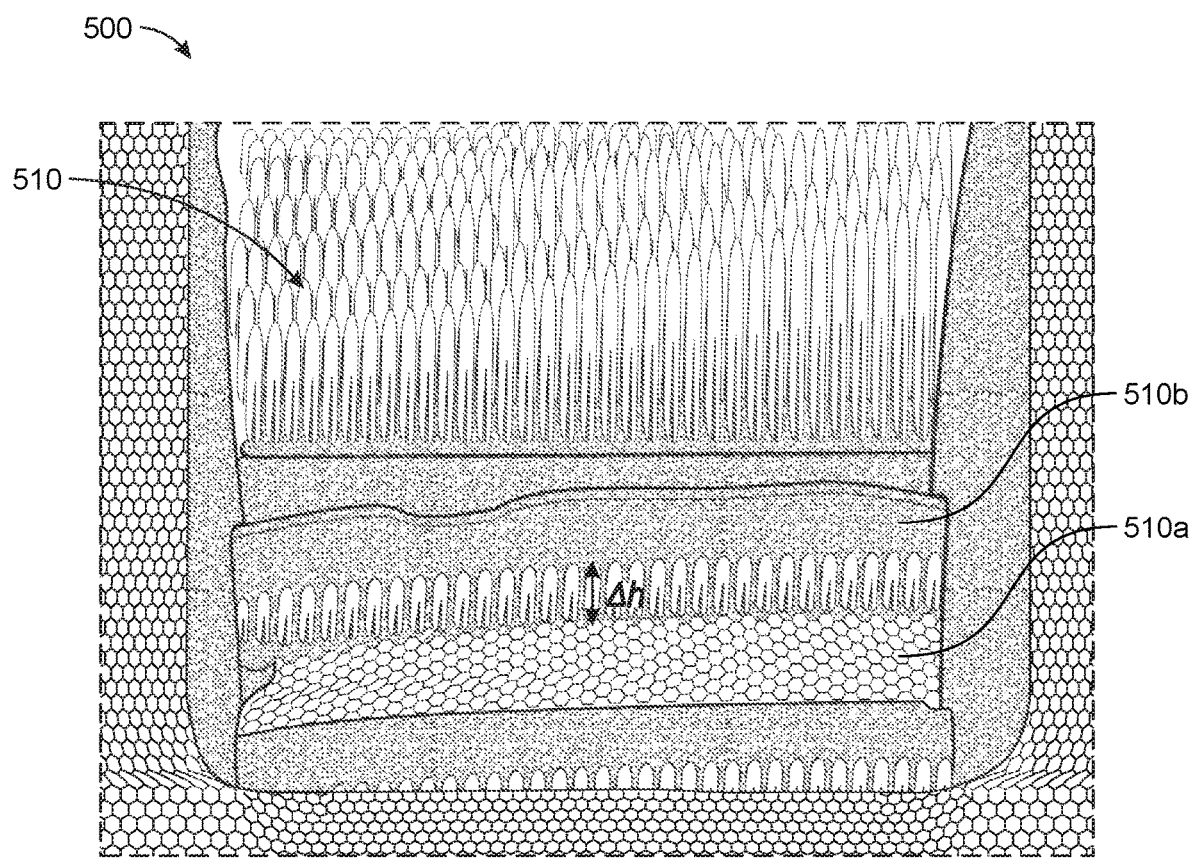
FIG. 5 is a scanning electron microscope (SEM) image of a sample delayered according to some embodiments.

Despite the mixed nature of the endpoint detection signal in the milling process discussed with respect to FIGS. 4A and 4B, the inventors have identified a unique and novel method of utilizing the endpoint detection signal to accurately estimate, in real time, the actual milled depth D1 and D2 in regions 410a and 410b, respectively, at any given time. To provide an illustrative example, reference is made to FIG. 5, which is a scanning electron microscope (SEM) image of sample 500 at a particular point in time of a delayering process. As shown in FIG. 5, sample 500 includes a region 510 that has been subject to many iterations (e.g., many thousand or even several million iterations) of a delayering process in which a focused ion beam was scanned across region 510 using a scan pattern, such as pattern 400. Region 510 includes a first sub-region 510a and a second sub-region 510b. The sub-regions 510a, 510b predominantly comprise the same stacks of alternating layers as described above with respect to FIGS. 4A and 4B. Sub-region 510a further includes multiple vias (visible but not labeled) formed through the sub-region that give sub-region 510a a different geometry from, and thus a different milling rate than, sub-region 510b. At the point in the delayering process in which the SEM shown in FIG. 5 was taken, the different milling rates of sub-regions 510a and 510b have resulted in a height difference between the two sub-regions represented by Δh.

As a sample, such as sample 500, is milled an endpoint detection signal can be generated and evaluated to analyze characteristics of the materials being milled over time. For example, electrons generated during the milling process can be detected by electron detectors associated with the evaluation tool (e.g., detector 150 of evaluation tool 100) and plotted over time. Looking and relying on the endpoint detection signal by itself for sample 500 would identify an endpoint that was somewhere between the depth of sub-region 510a (with its faster milling rate) and sub-region 510b (with its slower milling rate). Thus, relying on the endpoint detection signal alone would result in identifying an endpoint that was wrong for both of the two sub-regions.

Embodiments of the disclosure recognize that the plotted endpoint detection signal from the scan pattern used to mill region 510 is actually made up of two separate oscillating frequency signals of nearly identical oscillating periods: a fast oscillating signal that is an average of the two frequencies and a slow oscillating signal that has a frequency representing the difference between the two frequencies. Embodiments can use these two separate signals combined with known information, such as the known depth of each of the layers in milled region 510, to accurately identify the milled depth in each of the sub-regions which can, in turn, be used to accurately endpoint (e.g., stop) the delayering process at a desired particular depth in either of the two sub-regions.

Figure 6:
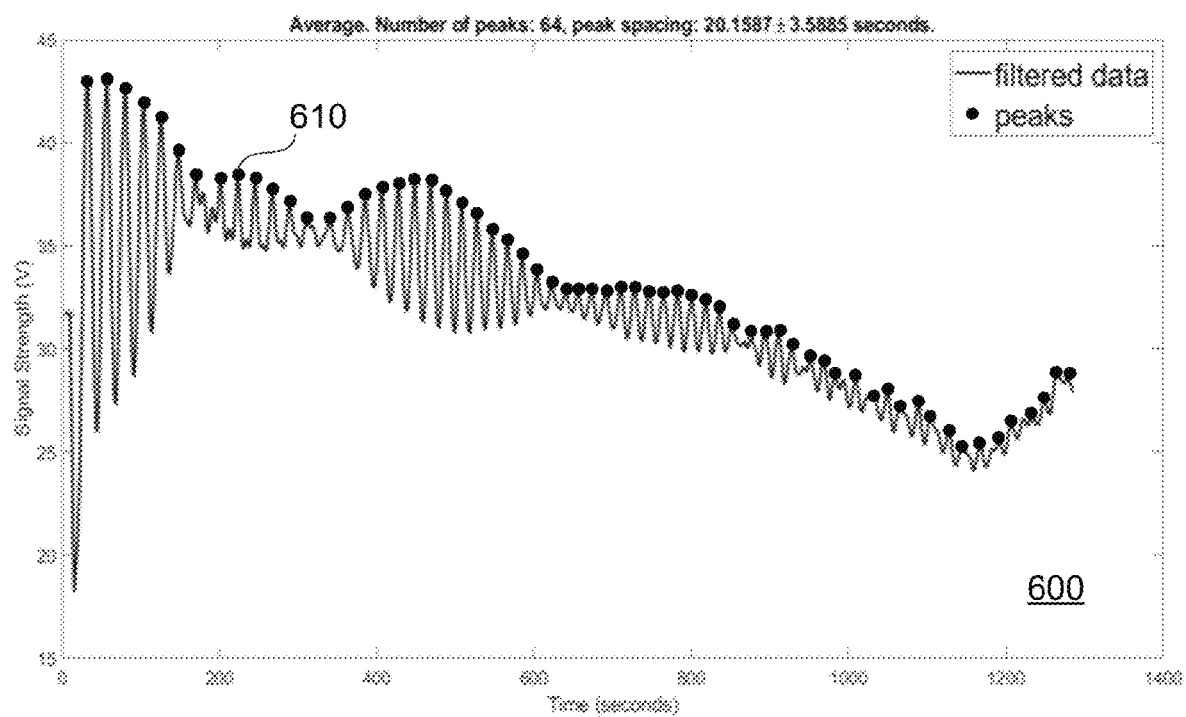
FIG. 6 is a graph illustrating a fast oscillation analysis of an endpoint detection signal according to some embodiments.
Figure 7:
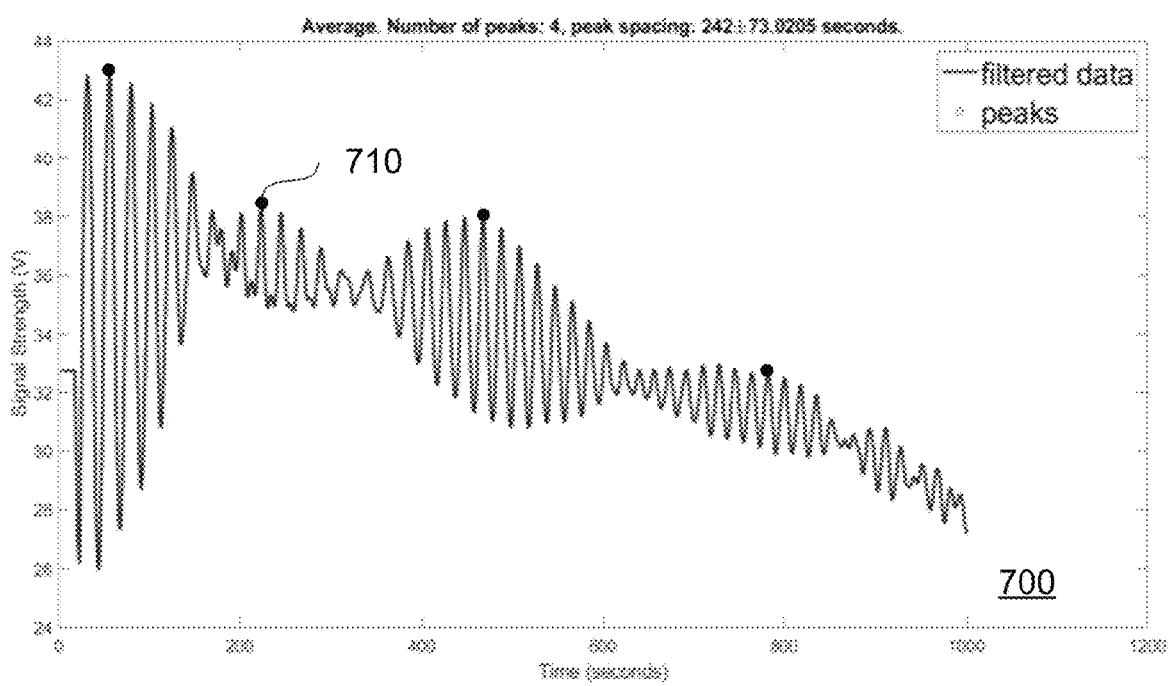
FIG. 7 is a graph illustrating a slow oscillation analysis of an endpoint detection signal according to some embodiments.

For example, FIGS. 6 and 7 represent a fast oscillation analysis and slow oscillation analysis, respectively, of the same signal generated from a delayering process implemented on sample 500. Specifically, FIG. 6 is a graph plotting a fast oscillation analysis 600 of an endpoint detection signal from sample 500 over time where sixty-four separate peaks 610 (each represented by a black dot) are identified, while FIG. 7 is a graph plotting a slow oscillation analysis 700 of the same endpoint detection signal where four separate peaks 710 (each also being represented by a black dot) are identified.

Mathematically, the endpoint detection signal, which is dependent on time "t", can be represented by the fast oscillating signal 600 enclosed by an envelope of a slow oscillating signal 700 as follows:

$$\sin(2\pi f_1 t) + \sin(2\pi f_2 t) = 2\sin\left(2\pi\left(\frac{f_1+f_2}{2}\right)t\right)\cos\left(2\pi\left(\frac{f_1-f_2}{2}\right)t\right)$$
$$= 2\sin(2\pi f_{fast}t)\cos(2\pi f_{slow}t)$$

The frequencies $f_1$ and $f_2$ are the original frequencies of different sub-regions and $f_{fast}$ is the average ($0.5\times(f_1+f_2)$)— shown in FIG. 6) of the frequencies while $f_{slow}$ is half the difference of their frequencies ($0.5 \times (f_1-f_2)$—shown in FIG. 7).

Knowing, in real time, the original frequencies $f_1$ and $f_2$, and knowing the thickness of each of the double layers (e.g., layers 320, 330), embodiments of the disclosure can accurately estimate the different depths in each of the sub-regions 310a, 310b in real time. For example, the formula set forth above can provide the difference in the count of double layers 320, 330 that represents the Δh between sub-regions 310a, 310b. Knowing this difference in counts, and knowing the thickness of the double layers (for example, each double layer throughout the depth of the sample can have the same thickness as the other double layers), embodiments can readily determine the milling depth within each sub-region.

For instance, in the example shown in FIG. 5, embodiments of the disclosure estimated, in real-time, that Δh was 615 nm. Later measurements demonstrated Δh to be 617 nm, indicating that the calculated estimate had an error margin of than 1 percent.

Example of a Sample to be Milled

Figure 8:
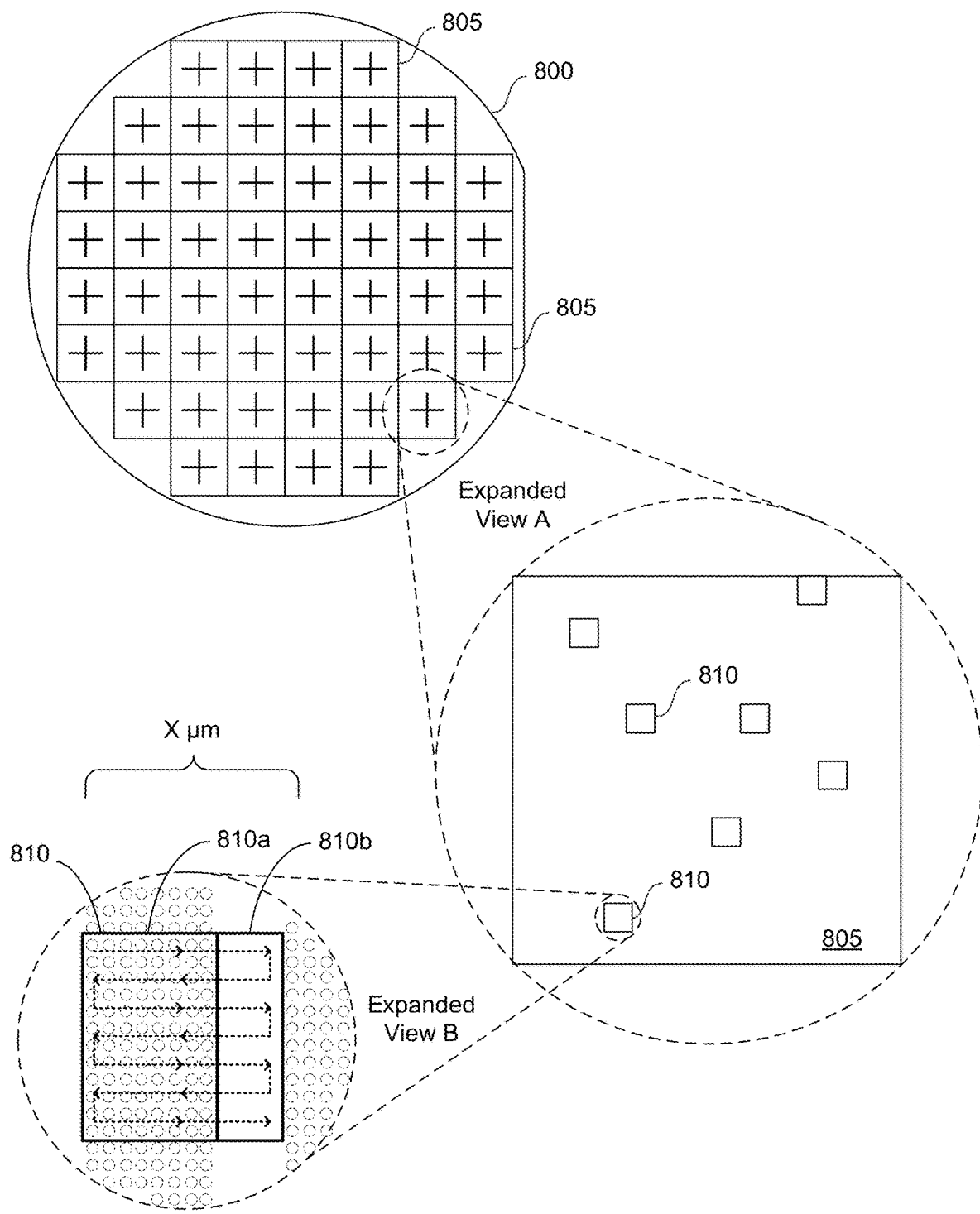
FIG. 8 is a simplified illustration of an area on a semiconductor wafer that can be delayered according to some embodiments.

As stated above, embodiments of the disclosure can be used to delayer many different types of samples including electronic circuits formed on semiconductor structures, solar cells formed on a polycrystalline or other substrate, nanostructures formed on various substrates and the like. As one non-limiting example, FIG. 8 is a simplified illustration of an area on a semiconductor wafer that can be delayered according to some embodiments. Specifically, FIG. 8 includes a top view of wafer 800 along with two expanded views of specific portions of wafer 800. Wafer 800 can be, for example, a 200 mm or 300 mm semiconductor wafer and can include multiple integrated circuits 805 (fifty two in the example depicted) formed thereon. The integrated circuits 805 can be at an intermediate stage of fabrication and the delayering techniques described herein can be used to evaluate and analyze one or more regions 810 of the integrated circuits that include two or more sections adjacent to each other that include double-layers of a known thickness extending through the different regions but have different geometries and thus exhibit different milling rates. For example, Expanded View A of FIG. 8 depicts multiple regions 810 of one of the integrated circuits 805 that can be evaluated and analyzed according to the techniques described herein. Expanded View B depicts one of those regions 810 that includes a first sub-region 810a having an array of holes formed therein and a second sub-region 810b that is a generally solid portion separating adjacent arrays of holes. Sub-regions 810a and 810b can include the same double-stacked layers extending from an upper surface of the region many layers down into the depth of the region, but because of the differing geometries in sub-regions 810a and 810b, the two sub-regions also exhibit different milling rates.

Embodiments of the disclosure can analyze and evaluate region 810 by sequentially milling away an uppermost layer of the region. The milling process can mill region 810 by scanning the FIB back and forth within the region according to a raster pattern, such as the scan pattern 400 illustrated above.

The removed portion can extend across the entirety of the region 810 in both the X and Y directions but, due to the different milling rates in sub-regions 810a and 810b, the removed portion can have a depth in the Z direction that differs in sub-region 810a as compared to sub-region 810b.

For example, if region 810 is a square having a length and width of X microns, separate and very thin slices (as thin as 1 atomic layer or less) of X by X microns can be sequentially removed from region 810 during the milling process where, in each layer, the removed square includes material from sub-region 810a and material from sub-region 810b. After a lengthy delayering process, however, and due to the different milling rates between the sub-regions, more layers of material might be removed in sub-region 810a as compared to sub-region 810b resulting in a milled portion of sub-region 810a being deeper than the milled portion in sub-region 810b.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. As one example, while FIG. 3A shows region 310 as having at least nine sets of alternating layers 320, 330, it is to be understood that FIGS. 3A and 3B are for illustrative purposes only and embodiments of the disclosure are not limited to the particulars shown in the figures. For example, the embodiments of the disclosure are not limited to any particular number of sets of alternating layers 320, 330 and in some embodiments there may be 50, 75, 100 or more sets of alternating layers. Additionally, while FIG. 3A depicts multiple sets of two alternating layers 320, 330, it is to be understood that in some instances additional layers, such as adhesion layers and/or seed layers may be formed between the two layers 320, 330 and that in some embodiments each set of alternating layers may include three or more different layers. As another example, while sample 300 discussed with respect to FIGS. 3A and 3B above included vias 340 that were filled with a conductive material, some embodiments can operate on samples prior to the vias being filled (and thus empty) or with the vias being filled with a different material.

Additionally, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. Also, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Because the illustrated embodiments of the present disclosure may for the most part, be implemented using electronic components and equipment known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of evaluating a region of a sample that includes a first sub-region and a second sub-region, adjacent to the first sub-region, the region comprising a plurality of sets of vertically-stacked double-layers extending through both the first and second sub-regions with a geometry or orientation of the vertically-stacked double layers in the first sub-region being different than a geometry or orientation of the vertically-stacked double layers in the second region resulting in the first sub-region having a first milling rate and the second sub-region having a second milling rate different than the first milling rate, the method comprising:

milling the region of a sample by scanning a focused ion beam over the region a plurality of iterations in which, for each iteration, the focused ion beam is scanned over the first sub-region and the second sub-region generating secondary electrons and secondary ions from each of the first and second sub-regions;

detecting, during the milling, at least one of the generated secondary electrons or the secondary ions;

generating, in real-time, an endpoint detection signal from the at least one of detected secondary electrons or secondary ions, the endpoint detection signal including a fast oscillating signal having a first frequency and a slow oscillating signal having a second frequency, slower than the first frequency;

analyzing the fast and slow oscillating signals to determine original first and second frequencies of the fast and slow oscillating signals; and estimating, in real-time, a depth of each of the first and second sub-regions based on the determined first and second frequencies.

2. The method of evaluating a region of a sample set forth in claim 1 further comprising stopping the delayering process when a predetermined depth in at least one of the first and second sub-regions is reached.

3. The method of evaluating a region of a sample set forth in claim 1 wherein a count of secondary electrons cannot be used as an accurate end point detection signal.

4. The method of evaluating a region of a sample set forth in claim 1 wherein the estimating is further based on a known thickness of the layers and the milling time.

5. The method of evaluating a region of a sample set forth in claim 1 wherein the detecting, during the milling, detects the generated secondary electrons and the generating, in real-time, generates an endpoint detection signal from the detected secondary electrons.

6. The method of evaluating a region of a sample set forth in claim 1 wherein a geometry of the vertically-stacked double layers in the first sub-region is different than a geometry of the vertically-stacked double layers in the second region.

7. The method of evaluating a region of a sample set forth in claim 1 wherein a plurality of vias are formed in the first sub-region and no vias are formed in the second sub-region.

8. A system for evaluating a region of a sample that that includes a first sub-region and a second sub-region, adjacent to the first sub-region, the region comprising a plurality of sets of vertically-stacked double-layers extending through both the first and second sub-regions with a geometry or orientation of the vertically-stacked double layers in the first sub-region being different than a geometry or orientation of the vertically-stacked double layers in the second region resulting in the first sub-region having a first milling rate and the second sub-region having a second milling rate different than the first milling rate, the system comprising:

a vacuum chamber;

a sample support configured to hold a sample within the vacuum chamber during a sample evaluation process;

a focused ion beam (FIB) column configured to direct a second charged particle beam into the vacuum chamber;

a processor and a memory coupled to the processor, the memory including a plurality of computer-readable instructions that, when executed by the processor, cause the system to:

mill the region of a sample by scanning a focused ion beam over the region a plurality of iterations in which, for each iteration, the focused ion beam is scanned over the first sub-region and the second sub-region generating secondary electrons and secondary ions from each of the first and second sub-regions;

detect, during the milling, at least one of the generated secondary electrons or the secondary ions;

generate, in real-time, an endpoint detection signal from the at least one of detected secondary electrons or secondary ions, the endpoint detection signal including a fast oscillating signal having a first frequency and a slow oscillating signal having a second frequency, slower than the first frequency;

analyze the fast and slow oscillating signals to determine original first and second frequencies of the fast and slow oscillating signals; and estimate, in real-time, a depth of each of the first and second sub-regions based on the determined first and second frequencies.

9. The system set forth in claim 8 wherein the plurality of computer-readable instructions, when executed by the processor, further cause the system to stop the delayering process when a predetermined depth in at least one of the first and second sub-regions is reached.

10. The system set forth in claim 8 wherein a count of secondary electrons cannot be used as an accurate end point detection signal.

11. The system set forth in claim 8 wherein the estimating is further based on a known thickness of the layers and the milling time.

12. The system set forth in claim 8 wherein the detecting, during the milling, detects the generated secondary electrons and the generating, in real-time, generates an endpoint detection signal from the detected secondary electrons.

13. The system set forth in claim 8 wherein a geometry of the vertically-stacked double layers in the first sub-region is different than a geometry of the vertically-stacked double layers in the second region.

14. The system set forth in claim 8 wherein a plurality of vias are formed in the first sub-region and no vias are formed in the second sub-region.

15. A non-transitory computer-readable memory that stores instructions for evaluating a region of a sample a sample that includes a first sub-region and a second sub-region, adjacent to the first sub-region, the region comprising a plurality of sets of vertically-stacked double-layers extending through both the first and second sub-regions with a geometry or orientation of the vertically-stacked double layers in the first sub-region being different than a geometry or orientation of the vertically-stacked double layers in the second region resulting in the first sub-region having a first milling rate and the second sub-region having a second milling rate different than the first milling rate by:
  milling the region of a sample by scanning a focused ion beam over the region a plurality of iterations in which, for each iteration, the focused ion beam is scanned over the first sub-region and the second sub-region generating secondary electrons and secondary ions from each of the first and second sub-regions;
  detecting, during the milling, at least one of the generated secondary electrons or the secondary ions;
  generating, in real-time, an endpoint detection signal from the at least one of detected secondary electrons or secondary ions, the endpoint detection signal including a fast oscillating signal having a first frequency and a slow oscillating signal having a second frequency, slower than the first frequency;
  analyzing the fast and slow oscillating signals to determine original first and second frequencies of the fast and slow oscillating signals; and
  estimating, in real-time, a depth of each of the first and second sub-regions based on the determined first and second frequencies.

16. The non-transitory computer-readable memory set forth in claim 15 wherein the instructions for evaluating a region of a sample stop the delayering process when a predetermined depth in at least one of the first and second sub-regions is reached.

17. The non-transitory computer-readable memory set forth in claim 15 wherein a count of secondary electrons cannot be used as an accurate end point detection signal.

18. The non-transitory computer-readable memory set forth in claim 15 wherein the estimating is further based on a known thickness of the layers and the milling time.

19. The non-transitory computer-readable memory set forth in claim 15 wherein the detecting, during the milling, detects the generated secondary electrons and the generating, in real-time, generates an endpoint detection signal from the detected secondary electrons.

20. The system set forth in claim 8 wherein a geometry of the vertically-stacked double layers in the first sub-region is different than a geometry of the vertically-stacked double layers in the second region.

\* \* \* \* \*